US011054448B2

(12) United States Patent
Juntunen et al.

(10) Patent No.: US 11,054,448 B2
(45) Date of Patent: Jul. 6, 2021

(54) POWER TRANSFORMATION SELF CHARACTERIZATION MODE

(71) Applicant: Ademco Inc., Golden Valley, MN (US)

(72) Inventors: Robert D. Juntunen, Minnetonka, MN (US); Aaron J. Klein, Plymouth, MN (US); Devin Diedrich, Ramsey, MN (US)

(73) Assignee: Ademco Inc., Golden Valley, MN (US)

( * ) Notice: Subject to any disclaimer, the term of this patent is extended or adjusted under 35 U.S.C. 154(b) by 641 days.

(21) Appl. No.: 15/690,124

(22) Filed: Aug. 29, 2017

(65) Prior Publication Data

US 2018/0003744 A1 Jan. 4, 2018

Related U.S. Application Data

(63) Continuation-in-part of application No. 14/960,256, filed on Dec. 4, 2015, now Pat. No. 10,811,892, (Continued)

(51) Int. Cl.
*G01R 19/00* (2006.01)
*G01R 19/165* (2006.01)
(Continued)

(52) U.S. Cl.
CPC ........ *G01R 19/16533* (2013.01); *F24F 11/30* (2018.01); *H02J 3/32* (2013.01);
(Continued)

(58) Field of Classification Search
CPC ....... G01R 19/16533; F24F 11/30; H02J 3/32; H02J 7/0047; H02J 7/0068; H02J 7/007;
(Continued)

(56) References Cited

U.S. PATENT DOCUMENTS 3,464,673 A 9/1969 Cargo et al.
3,665,159 A 5/1972 Becker et al.
(Continued)

FOREIGN PATENT DOCUMENTS

CA 1035448 A 7/1978
DE 3334117 A1 4/1985
(Continued)

OTHER PUBLICATIONS

Logitech, "Harmony 880 Remote User Manual," v. 1, pp. 1-15, prior to Nov. 30, 2007.

(Continued)

*Primary Examiner* — Michael P Nghiem
(74) *Attorney, Agent, or Firm* — Shumaker & Sieffert, P.A.

(57) ABSTRACT

A system and approach for a self-calculating test of a heating, ventilation and air conditioning load. The test may be run upon meeting predetermined conditions. Thermostatic control of the load may be disabled when the load test starts. If a call for heat or cool is made at the thermostat, response to the call may be delayed until the load test is completed, and if AC power is lost during the test, the test may finish and allow detection of the phantom AC detection device with a loss of AC power. If a voltage of a storage capacitor falls below a battery boost threshold, the test may be cancelled to allow the phantom circuit charge the storage capacitor. The system and approach may incorporate load test states that include an initialize state, start test state, get baseline state, test measure state, stabilize measurement state, calculation state, and finalize results state.

7 Claims, 5 Drawing Sheets

Related U.S. Application Data which is a continuation-in-part of application No. 14/301,116, filed on Jun. 10, 2014, now abandoned, which is a continuation-in-part of application No. 14/300,228, filed on Jun. 9, 2014, now abandoned, said application No. 14/960,256 is a continuation-in-part of application No. 14/301,175, filed on Jun. 10, 2014, now Pat. No. 9,983,244, which is a continuation-in-part of application No. 14/300,232, filed on Jun. 9, 2014, now abandoned.

(60) Provisional application No. 62/088,314, filed on Dec. 5, 2014, provisional application No. 61/841,191, filed on Jun. 28, 2013.

(51) Int. Cl.

| | |
|---|---|
| ***H02J 7/00*** | (2006.01) |
| ***H02J 7/34*** | (2006.01) |
| ***F24F 11/30*** | (2018.01) |
| ***H02M 7/217*** | (2006.01) |
| ***H02M 5/293*** | (2006.01) |
| ***H02J 3/32*** | (2006.01) |
| ***H02J 9/06*** | (2006.01) |
| *F24F 11/63* | (2018.01) |
| *H02M 1/00* | (2006.01) |
| *H02J 9/00* | (2006.01) |

(52) U.S. Cl.

CPC ............ *H02J 7/007* (2013.01); *H02J 7/0047* (2013.01); *H02J 7/0068* (2013.01); *H02J 7/345* (2013.01); *H02J 9/061* (2013.01); *H02M 5/293* (2013.01); *H02M 7/217* (2013.01); *F24F 11/63* (2018.01); *H02J 9/002* (2013.01); *H02M 2001/009* (2013.01)

(58) Field of Classification Search

CPC ........ H02J 7/345; H02J 9/0061; H02M 5/293; H02M 7/217

USPC ............................................................ 702/64

See application file for complete search history.

(56) References Cited

U.S. PATENT DOCUMENTS 3,899,713 A 8/1975 Barkan et al.
3,942,028 A 3/1976 Baker
D245,750 S 9/1977 Maclean
4,078,720 A 3/1978 Nurnberg
4,079,366 A 3/1978 Wong
4,093,943 A 6/1978 Knight
4,151,387 A 4/1979 Peters, Jr.
4,174,807 A 11/1979 Smith et al.
D253,845 S 1/1980 Morrow
D253,846 S 1/1980 Morrow
4,197,571 A 4/1980 Grunert
4,206,872 A 6/1980 Levine
4,224,615 A 9/1980 Penz
4,232,819 A 11/1980 Bost
4,257,555 A 3/1981 Neel
4,264,034 A 4/1981 Hyltin et al.
4,274,045 A 6/1981 Goldstein
D261,422 S 10/1981 Morrow
4,296,334 A 10/1981 Wong
4,298,946 A 11/1981 Hartsell et al.
4,300,199 A 11/1981 Yoknis et al.
4,308,991 A 1/1982 Peinetti et al.
4,316,256 A 2/1982 Hendricks et al.
4,332,352 A 6/1982 Jaeger
4,337,822 A 7/1982 Hyltin et al.
4,337,893 A 7/1982 Flanders et al.
4,373,664 A 2/1983 Barker et al.
4,379,483 A 4/1983 Farley
4,382,544 A 5/1983 Stewart
4,384,213 A 5/1983 Bogel
4,386,649 A 6/1983 Hines et al.
4,388,692 A 6/1983 Jones et al.
4,431,134 A 2/1984 Hendricks et al.
4,446,913 A 5/1984 Krocker
4,479,604 A 10/1984 Didner
4,503,471 A 3/1985 Hanajima et al.
4,504,778 A 3/1985 Evans
4,506,827 A 3/1985 Jamieson et al.
D279,815 S 7/1985 Yuen
D280,660 S 9/1985 Muchenberger
4,556,169 A 12/1985 Zervos
4,585,164 A 4/1986 Butkovich et al.
4,606,401 A 8/1986 Levine et al.
4,621,336 A 11/1986 Brown
4,622,544 A 11/1986 Bially et al.
4,628,201 A 12/1986 Schmitt
4,641,013 A 2/1987 Dunnigan et al.
D288,597 S 3/1987 Young Se
4,646,964 A 3/1987 Parker et al.
4,692,596 A 9/1987 Payne
4,706,177 A 11/1987 Josephson
4,717,333 A 1/1988 Carignan
D294,292 S 2/1988 Suzuki
4,725,001 A 2/1988 Carney et al.
4,745,300 A 5/1988 Kammerer et al.
4,745,311 A 5/1988 Iwasaki
4,753,388 A 6/1988 Rummage
4,806,843 A 2/1989 Mertens et al.
4,811,163 A 3/1989 Fletcher
4,829,779 A 5/1989 Munson et al.
4,837,731 A 6/1989 Levine et al.
4,881,686 A 11/1989 Mehta
4,918,439 A 4/1990 Wozniak et al.
D309,656 S 7/1990 Lee
4,939,995 A 7/1990 Feinberg
4,942,613 A 7/1990 Lynch
4,948,040 A 8/1990 Kobayashi et al.
4,969,508 A 11/1990 Tate et al.
4,992,779 A 2/1991 Sugino et al.
4,997,029 A 3/1991 Otsuka et al.
5,005,365 A 4/1991 Lynch
5,012,973 A 5/1991 Dick et al.
5,024,265 A 6/1991 Buchholz et al.
5,025,134 A 6/1991 Bensoussan et al.
5,036,698 A 8/1991 Conti
5,038,851 A 8/1991 Mehta
D320,440 S 10/1991 Chiu
D321,048 S 10/1991 Chiu
5,053,752 A 10/1991 Epstein et al.
5,065,813 A 11/1991 Berkeley et al.
D322,121 S 12/1991 Chiu
D322,122 S 12/1991 Guetersloh et al.
5,081,411 A 1/1992 Walker
5,086,385 A 2/1992 Launey et al.
5,088,645 A 2/1992 Bell
5,118,963 A 6/1992 Gesin
5,120,983 A 6/1992 Samann
D328,342 S 7/1992 Pasch et al.
5,140,310 A 8/1992 DeLuca et al.
5,161,606 A 11/1992 Berkeley et al.
5,170,935 A 12/1992 Federspiel et al.
5,172,565 A 12/1992 Wruck et al.
5,181,653 A 1/1993 Foster et al.
5,187,797 A 2/1993 Nielsen et al.
5,192,874 A 3/1993 Adams
5,210,685 A 5/1993 Rosa
5,221,877 A 6/1993 Falk
5,226,591 A 7/1993 Ratz
5,230,482 A 7/1993 Ratz et al.
5,238,184 A 8/1993 Adams
5,251,813 A 10/1993 Kniepkamp
5,259,445 A 11/1993 Pratt et al.
5,272,477 A 12/1993 Tashima et al.
D342,989 S 1/1994 Wallen
5,277,244 A 1/1994 Mehta
5,289,047 A 2/1994 Broghammer
5,294,849 A 3/1994 Potter

(56) References Cited

U.S. PATENT DOCUMENTS

| | | | |
|---|---|---|---|
| 5,317,670 | A | 5/1994 | Elia |
| 5,329,991 | A | 7/1994 | Mehta et al. |
| 5,348,078 | A | 9/1994 | Dushane et al. |
| 5,351,035 | A | 9/1994 | Chrisco |
| 5,361,009 | A | 11/1994 | Lu |
| 5,386,577 | A | 1/1995 | Zenda |
| 5,390,206 | A | 2/1995 | Rein et al. |
| 5,404,934 | A | 4/1995 | Carlson et al. |
| 5,414,618 | A | 5/1995 | Mock et al. |
| D359,552 | S | 6/1995 | Chiu et al. |
| 5,429,649 | A | 7/1995 | Robin |
| 5,439,441 | A | 8/1995 | Grimsley et al. |
| 5,452,197 | A | 9/1995 | Rice |
| 5,482,209 | A | 1/1996 | Cochran et al. |
| 5,495,887 | A | 3/1996 | Kathnelson et al. |
| 5,502,618 | A | 3/1996 | Chiou |
| 5,506,572 | A | 4/1996 | Hills et al. |
| 5,526,422 | A | 6/1996 | Keen |
| 5,537,106 | A | 7/1996 | Mitsuhashi |
| 5,544,036 | A | 8/1996 | Brown, Jr. et al. |
| D374,070 | S | 9/1996 | Tomasiak et al. |
| D374,479 | S | 10/1996 | Bucher et al. |
| 5,566,879 | A | 10/1996 | Longtin |
| 5,570,837 | A | 11/1996 | Brown et al. |
| 5,579,197 | A | 11/1996 | Mengelt et al. |
| D376,639 | S | 12/1996 | Moore |
| 5,590,831 | A | 1/1997 | Manson et al. |
| 5,603,451 | A | 2/1997 | Helander et al. |
| D378,607 | S | 3/1997 | Chiu et al. |
| D378,778 | S | 4/1997 | Jane et al. |
| 5,654,813 | A | 8/1997 | Whitworth |
| 5,668,535 | A | 9/1997 | Hendrix et al. |
| 5,671,083 | A | 9/1997 | Connor et al. |
| D385,342 | S | 10/1997 | Jane et al. |
| 5,673,850 | A | 10/1997 | Uptegraph |
| 5,679,137 | A | 10/1997 | Erdman et al. |
| 5,682,206 | A | 10/1997 | Wehmeyer et al. |
| 5,711,785 | A | 1/1998 | Maxwell |
| 5,732,691 | A | 3/1998 | Maiello et al. |
| 5,736,795 | A | 4/1998 | Zuehlke et al. |
| 5,761,083 | A | 6/1998 | Brown, Jr. et al. |
| 5,782,296 | A | 7/1998 | Mehta |
| 5,801,940 | A | 9/1998 | Russ et al. |
| 5,810,908 | A | 9/1998 | Gray et al. |
| 5,818,428 | A | 10/1998 | Eisenbrandt et al. |
| 5,833,134 | A | 11/1998 | Ho et al. |
| 5,839,654 | A | 11/1998 | Weber |
| 5,840,094 | A | 11/1998 | Osendorf et al. |
| 5,862,737 | A | 1/1999 | Chin et al. |
| 5,873,519 | A | 2/1999 | Beilfuss |
| 5,886,697 | A | 3/1999 | Naughton et al. |
| 5,899,866 | A | 5/1999 | Cyrus et al. |
| 5,902,183 | A | 5/1999 | D'Souza |
| 5,903,139 | A | 5/1999 | Kompelien |
| 5,909,429 | A | 6/1999 | Satyanarayana et al. |
| 5,915,473 | A | 6/1999 | Ganesh et al. |
| 5,917,141 | A | 6/1999 | Naquin, Jr. |
| 5,917,416 | A | 6/1999 | Read |
| D413,328 | S | 8/1999 | Kazama |
| 5,937,942 | A | 8/1999 | Bias et al. |
| 5,947,372 | A | 9/1999 | Tiernan |
| 5,950,709 | A | 9/1999 | Krueger et al. |
| 6,009,355 | A | 12/1999 | Obradovich et al. |
| 6,013,121 | A | 1/2000 | Chin et al. |
| 6,018,700 | A | 1/2000 | Edel |
| 6,020,881 | A | 2/2000 | Naughton et al. |
| 6,032,867 | A | 3/2000 | Dushane et al. |
| D422,594 | S | 4/2000 | Henderson et al. |
| 6,059,195 | A | 5/2000 | Adams et al. |
| 6,081,197 | A | 6/2000 | Garrick et al. |
| 6,084,523 | A | 7/2000 | Gelnovatch et al. |
| 6,089,221 | A | 7/2000 | Mano et al. |
| 6,101,824 | A | 8/2000 | Meyer et al. |
| 6,104,963 | A | 8/2000 | Cebasek et al. |
| 6,119,125 | A | 9/2000 | Gloudeman et al. |
| 6,121,875 | A | 9/2000 | Hamm et al. |
| 6,140,987 | A | 10/2000 | Stein et al. |
| 6,141,595 | A | 10/2000 | Gloudeman et al. |
| 6,145,751 | A | 11/2000 | Ahmed |
| 6,149,065 | A | 11/2000 | White et al. |
| 6,152,375 | A | 11/2000 | Robison |
| 6,154,081 | A | 11/2000 | Pakkala et al. |
| 6,167,316 | A | 12/2000 | Gloudeman et al. |
| 6,190,442 | B1 | 2/2001 | Redner |
| 6,192,282 | B1 | 2/2001 | Smith et al. |
| 6,196,467 | B1 | 3/2001 | Dushane et al. |
| 6,205,041 | B1 | 3/2001 | Baker |
| 6,208,331 | B1 | 3/2001 | Singh et al. |
| 6,216,956 | B1 | 4/2001 | Ehlers et al. |
| 6,236,326 | B1 | 5/2001 | Murphy |
| 6,259,074 | B1 | 7/2001 | Brunner et al. |
| 6,260,765 | B1 | 7/2001 | Natale et al. |
| 6,285,912 | B1 | 9/2001 | Ellison et al. |
| 6,288,458 | B1 | 9/2001 | Berndt |
| 6,290,140 | B1 | 9/2001 | Pesko et al. |
| D448,757 | S | 10/2001 | Okubo |
| 6,315,211 | B1 | 11/2001 | Sartain et al. |
| 6,318,639 | B1 | 11/2001 | Toth |
| 6,321,637 | B1 | 11/2001 | Shanks et al. |
| 6,330,806 | B1 | 12/2001 | Beaverson et al. |
| 6,344,861 | B1 | 2/2002 | Naughton et al. |
| 6,351,693 | B1 | 2/2002 | Monie et al. |
| 6,356,038 | B2 | 3/2002 | Bishel |
| 6,385,510 | B1 | 5/2002 | Hoog et al. |
| 6,394,359 | B1 | 5/2002 | Morgan |
| 6,397,612 | B1 | 6/2002 | Kernkamp et al. |
| 6,398,118 | B1 | 6/2002 | Rosen et al. |
| 6,448,896 | B1 | 9/2002 | Bankus et al. |
| 6,449,726 | B1 | 9/2002 | Smith |
| 6,453,687 | B2 | 9/2002 | Sharood et al. |
| D464,948 | S | 10/2002 | Vasquez et al. |
| 6,460,774 | B2 | 10/2002 | Sumida et al. |
| 6,466,132 | B1 | 10/2002 | Caronna et al. |
| 6,478,233 | B1 | 11/2002 | Shah |
| 6,490,174 | B1 | 12/2002 | Kompelien |
| 6,502,758 | B2 | 1/2003 | Cottrell |
| 6,507,282 | B1 | 1/2003 | Sherwood |
| 6,512,209 | B1 | 1/2003 | Yano |
| 6,518,953 | B1 | 2/2003 | Armstrong |
| 6,518,957 | B1 | 2/2003 | Lehtinen et al. |
| 6,546,419 | B1 | 4/2003 | Humpleman et al. |
| 6,556,899 | B1 | 4/2003 | Harvey et al. |
| 6,566,768 | B2 | 5/2003 | Zimmerman et al. |
| 6,574,537 | B2 | 6/2003 | Kipersztok et al. |
| 6,578,770 | B1 | 6/2003 | Rosen |
| 6,580,950 | B1 | 6/2003 | Johnson et al. |
| 6,581,846 | B1 | 6/2003 | Rosen |
| 6,587,739 | B1 | 7/2003 | Abrams et al. |
| 6,595,430 | B1 | 7/2003 | Shah |
| 6,596,059 | B1 | 7/2003 | Greist et al. |
| D478,051 | S | 8/2003 | Sagawa |
| 6,608,560 | B2 | 8/2003 | Abrams |
| 6,619,055 | B1 | 9/2003 | Addy |
| 6,619,555 | B2 | 9/2003 | Rosen |
| 6,621,507 | B1 | 9/2003 | Shah |
| 6,622,925 | B2 | 9/2003 | Carner et al. |
| 6,635,054 | B2 | 10/2003 | Fjield et al. |
| 6,663,010 | B2 | 12/2003 | Chene et al. |
| 6,671,533 | B2 | 12/2003 | Chen et al. |
| 6,685,098 | B2 | 2/2004 | Okano et al. |
| 6,702,811 | B2 | 3/2004 | Stewart et al. |
| 6,726,112 | B1 | 4/2004 | Ho |
| D492,282 | S | 6/2004 | Lachello et al. |
| 6,771,996 | B2 | 8/2004 | Bowe et al. |
| 6,783,079 | B2 | 8/2004 | Carey et al. |
| 6,786,421 | B2 | 9/2004 | Rosen |
| 6,789,739 | B2 | 9/2004 | Rosen |
| 6,801,849 | B2 | 10/2004 | Szukala et al. |
| 6,807,041 | B2 | 10/2004 | Geiger et al. |
| 6,808,524 | B2 | 10/2004 | Lopath et al. |
| 6,810,307 | B1 | 10/2004 | Addy |
| 6,810,397 | B1 | 10/2004 | Qian et al. |
| 6,824,069 | B2 | 11/2004 | Rosen |
| 6,833,990 | B2 | 12/2004 | LaCroix et al. |

(56) References Cited

U.S. PATENT DOCUMENTS

| | | | |
|---|---|---|---|
| 6,842,721 B2 | 1/2005 | Kim et al. | |
| 6,851,621 B1 | 2/2005 | Wacker et al. | |
| 6,868,293 B1 | 3/2005 | Schurr et al. | |
| 6,893,438 B2 | 5/2005 | Hall et al. | |
| 6,934,862 B2 | 8/2005 | Sharood et al. | |
| D512,208 S | 12/2005 | Kubo et al. | |
| 6,973,410 B2 | 12/2005 | Seigel | |
| 7,001,495 B2 | 2/2006 | Essalik et al. | |
| 7,013,845 B1 | 3/2006 | McFarland et al. | |
| D520,989 S | 5/2006 | Miller | |
| 7,050,026 B1 | 5/2006 | Rosen | |
| 7,055,759 B2 | 6/2006 | Wacker et al. | |
| 7,080,358 B2 | 7/2006 | Kuzmin | |
| 7,083,109 B2 | 8/2006 | Pouchak | |
| 7,083,189 B2 | 8/2006 | Ogata | |
| 7,084,774 B2 | 8/2006 | Martinez | |
| 7,089,088 B2 | 8/2006 | Terry et al. | |
| 7,108,194 B1 | 9/2006 | Hankins, II | |
| 7,119,431 B1 | 10/2006 | Hopper et al. | |
| 7,130,719 B2 | 10/2006 | Ehlers et al. | |
| D531,588 S | 11/2006 | Peh | |
| 7,133,748 B2 | 11/2006 | Robinson | |
| D533,515 S | 12/2006 | Klein et al. | |
| 7,146,253 B2 | 12/2006 | Hoog et al. | |
| 7,152,806 B1 | 12/2006 | Rosen | |
| 7,156,318 B1 | 1/2007 | Rosen | |
| 7,163,156 B2 | 1/2007 | Kates | |
| 7,188,002 B2 | 3/2007 | Chapman, Jr. et al. | |
| D542,236 S | 5/2007 | Klein et al. | |
| 7,212,887 B2 | 5/2007 | Shah et al. | |
| 7,222,800 B2 | 5/2007 | Wruck et al. | |
| 7,225,054 B2 | 5/2007 | Amundson et al. | |
| 7,231,605 B1 | 6/2007 | Ramakasavan | |
| 7,232,075 B1 | 6/2007 | Rosen | |
| 7,240,289 B2 | 7/2007 | Naughton et al. | |
| 7,244,294 B2 | 7/2007 | Kates | |
| 7,261,762 B2 | 8/2007 | Kang et al. | |
| 7,263,283 B2 | 8/2007 | Knepler | |
| 7,274,973 B2 | 9/2007 | Nichols et al. | |
| 7,302,642 B2 | 11/2007 | Smith et al. | |
| 7,331,187 B2 | 2/2008 | Kates | |
| 7,331,426 B2 | 2/2008 | Jahkonen | |
| 7,341,201 B2 | 3/2008 | Stanimirovic | |
| 7,354,005 B2 | 4/2008 | Carey et al. | |
| RE40,437 E | 7/2008 | Rosen | |
| 7,419,532 B2 | 9/2008 | Sellers et al. | |
| 7,435,278 B2 | 10/2008 | Terlson | |
| 7,451,606 B2 | 11/2008 | Harrod | |
| 7,452,396 B2 | 11/2008 | Terlson et al. | |
| 7,476,988 B2 | 1/2009 | Mulhouse et al. | |
| 7,489,094 B2 | 2/2009 | Steiner et al. | |
| 7,496,627 B2 | 2/2009 | Moorer et al. | |
| 7,500,026 B2 | 3/2009 | Fukanaga et al. | |
| 7,505,914 B2 | 3/2009 | McCall | |
| 7,542,867 B2 | 6/2009 | Steger et al. | |
| 7,556,207 B2 | 7/2009 | Mueller et al. | |
| 7,574,283 B2 | 8/2009 | Wang et al. | |
| 7,584,897 B2 | 9/2009 | Schultz et al. | |
| 7,594,960 B2 | 9/2009 | Johansson | |
| 7,595,613 B2 | 9/2009 | Thompson et al. | |
| 7,600,694 B2 | 10/2009 | Helt et al. | |
| 7,604,046 B2 | 10/2009 | Bergman et al. | |
| 7,617,691 B2 | 11/2009 | Street et al. | |
| 7,636,615 B2 | 12/2009 | Pfingsten et al. | |
| 7,642,674 B2 | 1/2010 | Mulhouse et al. | |
| 7,644,591 B2 | 1/2010 | Singh et al. | |
| 7,665,019 B2 | 2/2010 | Jaeger | |
| 7,676,282 B2 | 3/2010 | Bosley | |
| 7,692,559 B2 | 4/2010 | Face et al. | |
| 7,707,189 B2 | 4/2010 | Haselden et al. | |
| 7,713,339 B2 | 5/2010 | Johansson | |
| 7,739,282 B1 | 6/2010 | Smith et al. | |
| 7,755,220 B2 | 7/2010 | Sorg et al. | |
| D621,019 S | 8/2010 | Kim et al. | |
| 7,770,242 B2 | 8/2010 | Sell | |
| 7,786,620 B2 | 8/2010 | Vuk et al. | |
| 7,793,056 B2 | 9/2010 | Boggs et al. | |
| 7,814,516 B2 | 10/2010 | Stecyk et al. | |
| 7,837,676 B2 | 11/2010 | Sinelnikov et al. | |
| 7,838,803 B1 | 11/2010 | Rosen | |
| 7,852,645 B2 | 12/2010 | Fouquet et al. | |
| 7,859,815 B2 | 12/2010 | Black et al. | |
| D630,310 S | 1/2011 | Beland et al. | |
| D631,145 S | 1/2011 | Beland et al. | |
| 7,865,252 B2 | 1/2011 | Clayton | |
| 7,904,608 B2 | 3/2011 | Price | |
| 7,941,431 B2 | 5/2011 | Bluhm et al. | |
| 7,952,485 B2 | 5/2011 | Schecter et al. | |
| 7,956,719 B2 | 6/2011 | Anderson, Jr. et al. | |
| 7,957,775 B2 | 6/2011 | Allen, Jr. et al. | |
| 7,984,220 B2 | 7/2011 | Gerard et al. | |
| 7,992,764 B2 | 8/2011 | Magnusson | |
| 7,992,794 B2 | 8/2011 | Leen et al. | |
| D645,130 S | 9/2011 | Goldstein et al. | |
| 8,032,254 B2 | 10/2011 | Amundson et al. | |
| 8,060,470 B2 | 11/2011 | Davidson et al. | |
| 8,087,593 B2 | 1/2012 | Leen | |
| 8,091,796 B2 | 1/2012 | Amundson et al. | |
| 8,110,945 B2 | 2/2012 | Simard et al. | |
| 8,136,738 B1 | 3/2012 | Kopp | |
| 8,138,634 B2 | 3/2012 | Ewing et al. | |
| 8,167,216 B2 | 5/2012 | Schultz et al. | |
| 8,183,818 B2 | 5/2012 | Elhalis | |
| 8,216,216 B2 | 7/2012 | Warnking et al. | |
| 8,219,249 B2 | 7/2012 | Harrod et al. | |
| 8,239,066 B2 | 8/2012 | Jennings et al. | |
| 8,269,376 B1 | 9/2012 | Elberbaum | |
| 8,276,829 B2 | 10/2012 | Stoner et al. | |
| 8,280,556 B2 | 10/2012 | Besore et al. | |
| 8,314,517 B2 | 11/2012 | Simard et al. | |
| 8,346,396 B2 | 1/2013 | Amundson et al. | |
| 8,410,634 B2 | 4/2013 | Park | |
| 8,417,091 B2 | 4/2013 | Kim et al. | |
| 8,437,878 B2 | 5/2013 | Grohman et al. | |
| 8,511,577 B2 | 8/2013 | Warren et al. | |
| 8,523,083 B2 | 9/2013 | Warren et al. | |
| 8,532,190 B2 | 9/2013 | Shimizu et al. | |
| 8,532,827 B2 | 9/2013 | Stefanski et al. | |
| 8,554,374 B2 | 10/2013 | Lunacek et al. | |
| 8,574,343 B2 | 11/2013 | Bisson et al. | |
| 8,604,746 B2 | 12/2013 | Lee | |
| 8,613,792 B2 | 12/2013 | Ragland et al. | |
| 8,621,881 B2 | 1/2014 | Votaw et al. | |
| 8,623,117 B2 | 1/2014 | Zavodny et al. | |
| 8,629,661 B2 | 1/2014 | Shimada et al. | |
| 8,680,442 B2 | 3/2014 | Reusche et al. | |
| 8,704,672 B2 | 4/2014 | Hoglund et al. | |
| 8,729,875 B2 | 5/2014 | Vanderzon | |
| 8,731,723 B2 | 5/2014 | Boll et al. | |
| 8,734,565 B2 | 5/2014 | Hoglund et al. | |
| 8,752,771 B2 | 6/2014 | Warren et al. | |
| 8,768,341 B2 | 7/2014 | Coutelou et al. | |
| 8,881,172 B2 | 11/2014 | Schneider | |
| 8,886,179 B2 | 11/2014 | Pathuri et al. | |
| 8,886,314 B2 | 11/2014 | Crutchfield et al. | |
| 8,892,223 B2 * | 11/2014 | Leen .................. | G05D 23/1917 700/83 |
| 8,902,071 B2 | 12/2014 | Barton et al. | |
| 9,002,523 B2 | 4/2015 | Erickson et al. | |
| 9,071,145 B2 | 6/2015 | Simard et al. | |
| 9,080,784 B2 | 7/2015 | Dean-Hendricks et al. | |
| 9,098,279 B2 | 8/2015 | Mucignat et al. | |
| 9,143,006 B2 | 9/2015 | Lee et al. | |
| 9,148,067 B2 | 9/2015 | Karlsson et al. | |
| 9,206,993 B2 | 12/2015 | Barton et al. | |
| 9,234,877 B2 | 1/2016 | Hattersley et al. | |
| 9,261,287 B2 | 2/2016 | Warren et al. | |
| 9,264,035 B2 | 2/2016 | Tousignant et al. | |
| 9,272,647 B2 | 3/2016 | Gawade et al. | |
| 9,366,448 B2 | 6/2016 | Dean-Hendricks et al. | |
| 9,374,268 B2 | 6/2016 | Budde et al. | |
| 9,419,602 B2 | 8/2016 | Tousignant et al. | |
| D789,956 S | 6/2017 | Ortega et al. | |
| 9,673,811 B2 * | 6/2017 | Kim ..................... | H03K 17/687 |

(56) References Cited

U.S. PATENT DOCUMENTS

| | | | |
|---|---|---|---|
| 9,823,672 | B2 | 11/2017 | McCurnin et al. |
| 9,857,091 | B2 * | 1/2018 | Robideau ................. F24F 11/30 |
| 9,983,244 | B2 * | 5/2018 | Juntunen ................. H02J 50/00 |
| D829,113 | S | 9/2018 | Read et al. |
| 2001/0029585 | A1 | 10/2001 | Simon et al. |
| 2001/0052459 | A1 | 12/2001 | Essalik et al. |
| 2002/0011923 | A1 | 1/2002 | Cunningham et al. |
| 2002/0022991 | A1 | 2/2002 | Sharood et al. |
| 2002/0082746 | A1 | 6/2002 | Schubring et al. |
| 2002/0092779 | A1 | 7/2002 | Essalik et al. |
| 2003/0033230 | A1 | 2/2003 | McCall |
| 2003/0034897 | A1 | 2/2003 | Shamoon et al. |
| 2003/0034898 | A1 | 2/2003 | Shamoon et al. |
| 2003/0040279 | A1 | 2/2003 | Ballweg |
| 2003/0060821 | A1 | 3/2003 | Hall et al. |
| 2003/0103075 | A1 | 6/2003 | Rosselot |
| 2003/0177012 | A1 | 9/2003 | Drennan |
| 2004/0262410 | A1 | 12/2004 | Hull |
| 2005/0083168 | A1 | 4/2005 | Breitenbach |
| 2005/0270151 | A1 | 12/2005 | Winick |
| 2006/0112700 | A1 | 6/2006 | Choi et al. |
| 2006/0196953 | A1 | 9/2006 | Simon et al. |
| 2006/0242591 | A1 | 10/2006 | Van Dok et al. |
| 2007/0013534 | A1 | 1/2007 | DiMaggio |
| 2007/0045429 | A1 | 3/2007 | Chapman, Jr. et al. |
| 2007/0114293 | A1 | 5/2007 | Gugenheim |
| 2007/0114295 | A1 | 5/2007 | Jenkins et al. |
| 2007/0114848 | A1 | 5/2007 | Mulhouse et al. |
| 2007/0119961 | A1 | 5/2007 | Kaiser |
| 2007/0241203 | A1 | 10/2007 | Wagner et al. |
| 2007/0277061 | A1 | 11/2007 | Ashe |
| 2007/0289731 | A1 | 12/2007 | Deligiannis et al. |
| 2007/0290924 | A1 | 12/2007 | McCoy |
| 2007/0296260 | A1 | 12/2007 | Stossel |
| 2007/0299560 | A1 | 12/2007 | LaHue et al. |
| 2008/0015740 | A1 | 1/2008 | Osann |
| 2008/0133033 | A1 | 6/2008 | Wolff et al. |
| 2009/0143880 | A1 | 6/2009 | Amundson et al. |
| 2009/0165644 | A1 | 7/2009 | Campbell |
| 2010/0006660 | A1 | 1/2010 | Leen et al. |
| 2010/0084482 | A1 | 4/2010 | Kennedy et al. |
| 2010/0204834 | A1 | 8/2010 | Comerford et al. |
| 2011/0073101 | A1 | 3/2011 | Lau et al. |
| 2011/0133558 | A1 | 6/2011 | Park |
| 2011/0185895 | A1 | 8/2011 | Freen |
| 2011/0251807 | A1 | 10/2011 | Rada et al. |
| 2011/0291606 | A1 | 12/2011 | Lee |
| 2012/0126019 | A1 | 5/2012 | Warren et al. |
| 2012/0199660 | A1 | 8/2012 | Warren et al. |
| 2012/0267089 | A1 | 10/2012 | Mucignat et al. |
| 2012/0323377 | A1 | 12/2012 | Hoglund et al. |
| 2013/0125572 | A1 | 5/2013 | Childs et al. |
| 2013/0140016 | A1 | 6/2013 | Storm et al. |
| 2013/0158714 | A1 | 6/2013 | Barton et al. |
| 2013/0158715 | A1 | 6/2013 | Barton et al. |
| 2013/0158717 | A1 | 6/2013 | Zywicki et al. |
| 2013/0158718 | A1 | 6/2013 | Barton et al. |
| 2013/0158720 | A1 | 6/2013 | Zywicki et al. |
| 2013/0213952 | A1 | 8/2013 | Boutin et al. |
| 2013/0238142 | A1 | 9/2013 | Nichols et al. |
| 2013/0245838 | A1 | 9/2013 | Zywicki et al. |
| 2013/0261807 | A1 | 10/2013 | Zywicki et al. |
| 2014/0062672 | A1 | 3/2014 | Gudan et al. |
| 2014/0312131 | A1 | 10/2014 | Tousignant et al. |
| 2014/0312697 | A1 | 10/2014 | Landry et al. |
| 2015/0001929 | A1 | 1/2015 | Juntunen et al. |
| 2015/0001930 | A1 * | 1/2015 | Juntunen .............. H02J 7/0068 307/24 |
| 2015/0002165 | A1 | 1/2015 | Juntunen et al. |
| 2015/0115045 | A1 | 4/2015 | Tu et al. |
| 2015/0144706 | A1 | 5/2015 | Robideau et al. |
| 2015/0145347 | A1 | 5/2015 | Kim et al. |
| 2015/0370265 | A1 | 12/2015 | Ren et al. |
| 2015/0370268 | A1 | 12/2015 | Tousignant et al. |
| 2016/0010880 | A1 | 1/2016 | Bravard et al. |
| 2016/0164310 | A1 * | 6/2016 | Juntunen .............. H02M 7/217 320/134 |
| 2017/0134214 | A1 | 5/2017 | Sethuraman et al. |
| 2017/0192061 | A1 | 7/2017 | Park |
| 2017/0235291 | A1 | 8/2017 | Foslien et al. |
| 2018/0362181 | A1 * | 12/2018 | Iwashima ............. B64D 41/00 |

FOREIGN PATENT DOCUMENTS

| | | | |
|---|---|---|---|
| EP | 0070414 | A1 | 1/1983 |
| EP | 0434926 | B1 | 8/1995 |
| EP | 0976957 | A2 | 2/2000 |
| EP | 0678204 | B1 | 3/2000 |
| EP | 0985994 | A1 | 3/2000 |
| EP | 1033641 | A1 | 9/2000 |
| EP | 1143232 | A1 | 10/2001 |
| EP | 1074009 | B1 | 3/2002 |
| EP | 2138919 | A1 | 12/2009 |
| FR | 2491692 | A1 | 4/1982 |
| FR | 2711230 | A1 | 4/1995 |
| KR | 10-2007-0122413 | | 12/2007 |
| WO | 9711448 | A1 | 3/1997 |
| WO | 9739392 | A1 | 10/1997 |
| WO | 0043870 | A2 | 7/2000 |
| WO | 0152515 | A1 | 7/2001 |
| WO | 0179952 | A1 | 10/2001 |
| WO | 0223744 | A2 | 3/2002 |
| WO | 2010021700 | A1 | 2/2010 |
| WO | 2014/210247 | A1 | 12/2014 |
| WO | 2014/210262 | A1 | 12/2014 |

OTHER PUBLICATIONS

Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
Lux, "TX1500 Series Smart Temp Electronic Thermostat," Owner's Manual, 6 pages, prior to Jul. 7, 2004.
METASYS, "HVAC PRO for Windows User's Manual," 308 pages, 1998.
Mounting Template for Ritetemp Thermostat 8082, 1 page, 2002.
OMRON Electronic Components, LLC, "Micro Tilt Sensor D6B," Cat. No. JB301-E3-01, 6 pages, Mar. 2005.
OMRON Electronic Components, LLC, "Micro Tilt Sensor D6B," Cat. No. B02WAD1, 2 pages, Jun. 2002.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.

(56) References Cited

OTHER PUBLICATIONS

Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Reconfigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 For All Programmable Digital Thermostat," Owner's Manual P/N P374-1100FM, 23 pages, Nov. 1998.
Totaline, "1 For All Programmable Digital Thermostat," Owner's Manual P/N P474-1050, 21 pages, Nov. 1998.
Totaline, "1 For All Programmable Digital Thermostat," Owner's Manual P/N P374-1100, 24 pages, Apr. 2001.
Totaline, "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.
Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTW-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
Cirrus Logic, Inc., "CS1501 Digital Power Factor Correction Control IC," 16 pages, 2012.
International Search Report for Corresponding Application No. PCT/US2014/044229, dated Oct. 13, 2014.
U.S. Appl. No. 14/300,232, filed Jun. 9, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.
Signetics Linear Products, "TDA1024 Zero Crossing Triac Trigger," Product Specification, 14 pages, Sep. 1985.
"RCS X10 Thermostat Plug-in for HomeSeer Beta Version 2.0. 105," 25 pages, prior to Sep. 7, 2011.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—TouchLinc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar . . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.
"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls For Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.
Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.

(56) References Cited

OTHER PUBLICATIONS

BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p. 1174 (2 pages), Jan. 6, 1999.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control," Installation, Start-Up, and Operating Instructions, pp. 1-12, Aug. 1999.
Carrier, "Comfort Programmable Owner's Manual," Carrier Touch-N-Go, Catalog No: OM-TCPHP-4CA 60 pages, 2010.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 Non-Programmable Thermostat, 6 pages, prior to Apr. 21, 2005.
White-Rodgers Installation Instructions for Heating & Air Conditioning IF78 5/2 Day Programmable Thermostat, 7 pages, prior to Jul. 7, 2004.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.
www.icmcontrols.com, Simplecomfort, SC3801 2 Stage Heat/2 Stage Cool 2 Stage Heat Pump/Audio Changeover, 1 page, prior to Jul. 7, 2004.
Inventek, "Inventek Systems, ISM4319-M3X-L44-X Embedded Serial-to-Wi-Fi Module eS-WiFi 802.11 b/g/n Data Sheet", Inventek, "Inventek Systems, ISM4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Aprilaire, "Model 800 Residential Steam Humidifier, Owner's Manual," Jun. 2010, 9 pp.
Honeywell, "HM700A1000 Electrode Steam Humidifier, Installation Instructions," Sep. 2015, 28 pp.
Honeywell, "Steam Humidifier Professional Installation Instructions," Aug. 2014, 72 pp.
http://humidifiers.pirulitta.com/honeywell-electrode-steam-humidifier/, printed Dec. 22, 2017, 3 pp.
https://www.google.com/search?q=water+leak+detector&source=lnms . . . , "Humidifier Whole House—Google Search," printed Apr. 14, 2017, 20 pp.
Nortec, "RH2 Installation and Operation Manual," Nov. 24, 2010, 50 pp.
Prosecution history from U.S. Appl. No. 14/300,228, dated Apr. 5, 2017, 26 pp.
Prosecution history from U.S. Appl. No. 14/301,116, dated Jun. 19, 2014 through Jul. 31, 2019, 104 pp.
Prosecution history from U.S. Appl. No. 14/301,175, dated Jun. 19, 2014 through Apr. 13, 2018, 54 pp.
Prosecution history from U.S. Appl. No. 14/960,256 dated Dec. 15, 2017 through Oct. 16, 2019, 83 pp.
Prosecution history from U.S. Appl. No. 29/592,583, dated Jan. 5, 2018 through May 22, 2018, 25 pp.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions," 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012.
Freudenthal et al., "Communicating Extensive Smart Home Functionality to Users of All Ages: the Design of a Mixed-Initiative Multimodal Thermostat-Interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Harris et al., "Optimizing Memory Transactions," Microsoft Research Havard University, 12 pages, May 25, 2012.
Office Action for Canadian Application No. 2,774,907, dated Nov. 3, 2017.
Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
CorAccess, "Companion 6," User Guide, pp. 1-20, Jun. 17, 2002.
Danfoss RT51/51RF & RT52/52RF User Instructions, 2 pages, Jun. 2004.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.

(56) References Cited

OTHER PUBLICATIONS

Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System For Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 page; and screen shots of WebPad Device, 4 pages.
Honeywell, "RedLINK™ Wireless Comfort Systems," RedLINK Wireless Technology, 8 pages, Aug. 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
Honeywell, Wireless Entry/Exit Remote, Operating Manual, 9 pages, 2011.
http://hunter-thermostats.com/hunter_programmable_thermostats.html, Hunter Thermostat 44668 Specifications, and 44758 Specifications, 2 pages, Printed Jul. 13, 2011.
http://www.cc.gatech.edu/computing/classes/cs6751_94_fall/groupc/climate-2/node1.html, "Contents," 53 pages, printed Sep. 20, 2004.
http://www.ritetemp.info/rtMenu_13.html, Rite Temp 8082, 6 pages, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor," Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats," User's Manual, pp. 1-28, prior to Jul. 7, 2004.
Larsson, "Battery Supervision in Telephone Exchanges," Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
DeKoven et al., "Designing Collaboration in Consumer Products," Mar. 2001, 2 pp.

* cited by examiner

POWER TRANSFORMATION SELF CHARACTERIZATION MODE

This present application is a continuation-in-part of U.S. patent application Ser. No. 14/960,256, filed Dec. 4, 2015, which claims the benefit of U.S. Provisional Patent Application Ser. No. 62/088,314, filed Dec. 5, 2014. U.S. Provisional Patent Application Ser. No. 62/088,314, filed Dec. 5, 2014, is hereby incorporated by reference. U.S. patent application Ser. No. 14/960,256, filed Dec. 4, 2015, is hereby incorporated by reference.

This present application is a continuation-in-part of U.S. patent application Ser. No. 14/960,256, filed Dec. 4, 2015, which is a continuation-in-part of U.S. application Ser. No. 14/301,116, filed Jun. 10, 2014, now abandoned, which is a continuation-in-part of U.S. application Ser. No. 14/300,228, filed Jun. 9, 2014, now abandoned, and entitled "A Power Transformation System", which claims the claims the benefit of U.S. Provisional Application Ser. No. 61/841,191, filed Jun. 28, 2013, and entitled "A Power Transformation System". U.S. application Ser. No. 14/300,228, filed Jun. 9, 2014, now abandoned, is hereby incorporated by reference. U.S. Provisional Application Ser. No. 61/841,191, filed Jun. 28, 2013, is hereby incorporated by reference. U.S. application Ser. No. 14/301,116, filed Jun. 10, 2014, is hereby incorporated by reference.

This present application is a continuation-in-part of U.S. patent application Ser. No. 14/960,256, filed Dec. 4, 2015, which is a continuation-in-part of U.S. patent application Ser. No. 14/301,175, now U.S. Pat. No. 9,983,244, filed Jun. 10, 2014, which is a continuation-in-part of U.S. application Ser. No. 14/300,232, filed in Jun. 9, 2014, now abandoned, and entitled "A Power Transformation System with Characterization", which claims the claims the benefit of U.S. Provisional Application Ser. No. 61/841,191, filed Jun. 28, 2013, and entitled "A Power Transformation System". U.S. application Ser. No. 14/300,232, filed in Jun. 9, 2014, now abandoned, is hereby incorporated by reference. U.S. Provisional Application Ser. No. 61/841,191, filed Jun. 28, 2013, is hereby incorporated by reference. U.S. patent application Ser. No. 14/301,175, now U.S. Pat. No. 9,983,244, filed Jun. 10, 2014, is hereby incorporated by reference.

BACKGROUND

The present disclosure pertains to power resources and particularly to power resource management. More particularly, the disclosure pertains at least in part to battery resources.

SUMMARY

The disclosure reveals a system and approach for performing a power transformation self characterization mode for a heating and cooling system. A baseline of a reference voltage may be obtained. Whether the baseline obtained is equal to or greater than a predetermined or needed baseline may be determined. Obtaining the baseline until the baseline obtained is equal to or greater than the predetermined or needed baseline may be repeated. A measurement of a charge rate or a measurement of a voltage across a heating and cooling system load may be taken. Whether the charge rate is equal to or greater than a predetermined charging threshold or determining whether the voltage across the heating and cooling system load is equal to or greater than a predetermined voltage threshold may be determined. Whether the charge rate is zero, if neither the charge rate is equal to or greater than the predetermined charging threshold, nor the voltage across the heating and cooling system load is equal to or greater than the pre-determined voltage threshold may be determined. The measurements may be stabilized, if the charge rate is equal to or greater than the predetermined charging threshold, or if the voltage across the heating and cooling system load is equal to or greater than the predetermined voltage threshold. Taking a measurement of the charge rate may be returned to, if the charge rate is not zero. A calculation may be tested, if the charge rate is zero or if upon the stabilizing the measurement. Results may be finalized if the calculation is tested as satisfactory.

DESCRIPTION

Figure 1:
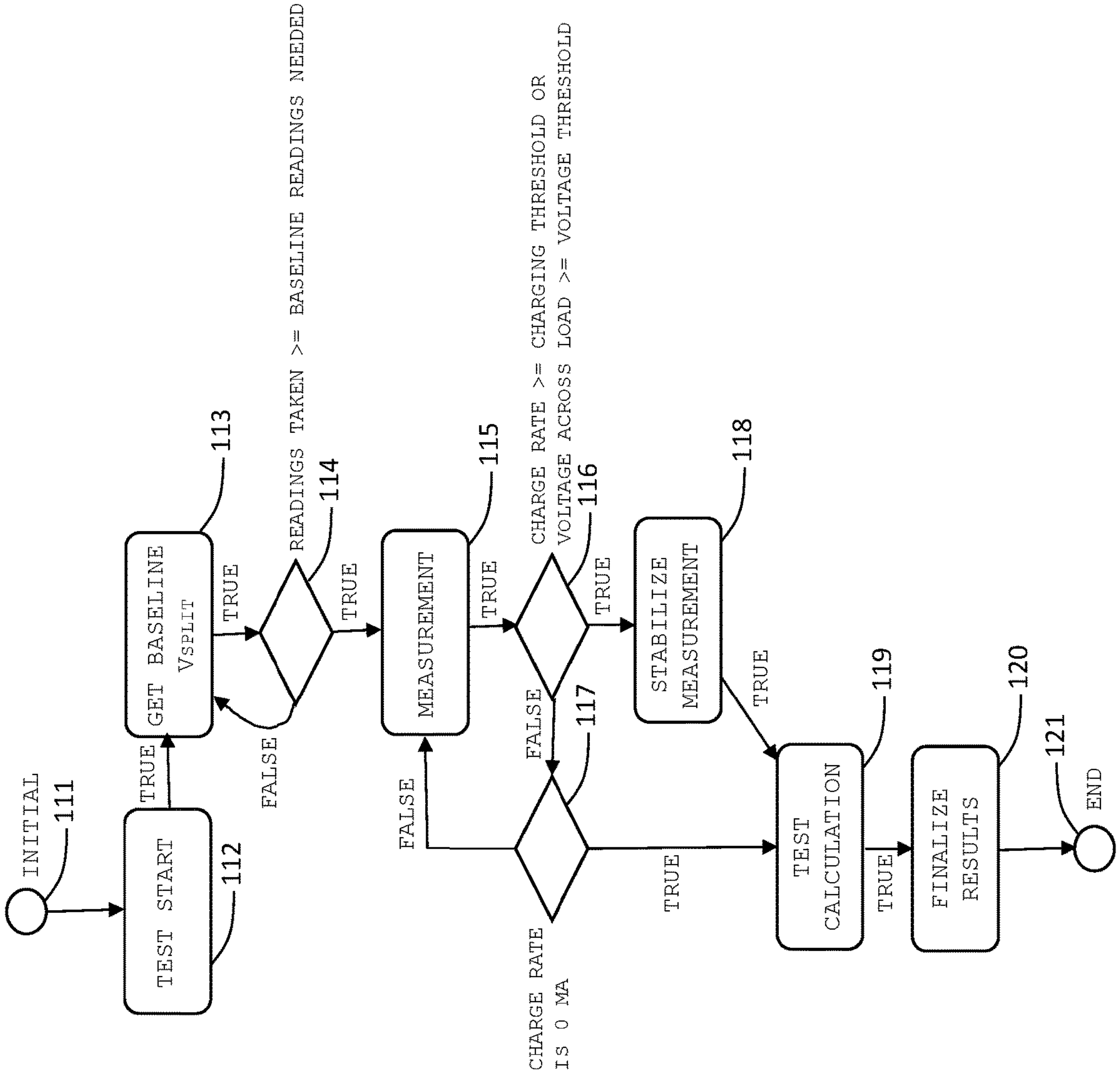
FIG. 1 is a diagram of an off cycle characterization approach for power transformation.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Aspects of the system or approach may be described in terms of symbols in the drawing. Symbols may have virtually any shape (e.g., a block) and may designate hardware, objects, components, activities, states, steps, procedures, and other items.

For pertinent information relative to the present system and approach, reference may be made to of U.S. application Ser. No. 14/960,256, filed Dec. 4, 2015, U.S. application Ser. No. 14/301,116, filed Jun. 10, 2014, U.S. application Ser. No. 14/300,228, filed in Jun. 9, 2014, now abandoned, U.S. application Ser. No. 14/301,175, filed Jun. 10, 2014, and U.S. application Ser. No. 14/300,232, filed in Jun. 9, 2014, now abandoned, all of which are hereby incorporated by reference.

In order for the power transformation system to work efficiently, the loads of equipment of the thermostat that are connected to various components of the system may need to be learned by the system. Increased efficiency of the power transformation system may prolong the battery life, creating a better user experience. The current implementation of the power transformation system might only discover the loads of equipment while the equipment is running. In some installations, the user may not necessarily run all equipment before the installation is finished, thus causing the power transformation system not necessarily to run as efficiently as possible. This may cause the system to run off of battery power and significantly decrease the battery life.

The power transformation system may introduce a new capability that allows the thermostat to learn the loads of equipment that the thermostat is connected to without having the user wait until the equipment is turned on. Knowing this information may allow the power transformation system to use the available loads to maximize charge current thereby minimizing the use of the battery and creating a better user experience.

Power transformation technology may use algorithms to manage a battery. Extending the battery life and/or managing how a product handles information around the battery's condition may be critical to a successful system. Power transformation, phantom and power stealing are terms that may be interchangeably used in certain contexts of the present description.

Relative to product resources, a battery management module (BMM) may need software services from a "phantom module", "power broker" and other low level board support package (BSP) software, such as an A2D, time bases and memory R/W in order to execute routines needed for successful deployment of the product. The memory resources should be volatile memory (VM) and non-volatile memory (NVM) resources to fulfill the needs of a fully functional power transformation BMM system.

FIG. 1 is a diagram of an off cycle characterization approach. At symbol 111 may occur an initial beginning. There may be a test start at symbol 112 and if true, then a baseline voltage (Vsplit) may be obtained at symbol 113. Upon receipt of the baseline, then a question at symbol 114 is whether the readings taken are equal to or greater than the baseline readings needed. If not, then another baseline reading may be obtained at symbol 113. This approach may continue until the readings of the baseline taken are equal to or greater than the baseline readings needed or predetermined. If so, then a measurement may be made at symbol 115. If the measurement of charge rate at symbol 115 is successful, then at a symbol 116 is a question of whether the charge rate is greater or equal to a charging threshold or a voltage across a load is equal to or greater than a voltage threshold, may be asked. If an answer is no, then at a symbol 117 a question of whether a charge rate is zero may be asked. If the rate is not zero, then another measurement may be made at symbol 115 and the same question at symbol 116 may be asked. If it is again not true that the charge rate is equal to or greater than the charging threshold or that the voltage across the load is equal to or greater than the voltage threshold, then the question of whether the charge rate is zero may be asked. If the answer is yes, then a test calculation may be made at symbol 119.

If the answer to the question at symbol 116 is true in that the charge rate is equal to or greater than the charging threshold or that the voltage across the load is equal to or greater than the voltage threshold, then the measurement may be stabilized at symbol 118. After stabilizing the measurement, a test calculation may be performed at symbol 119. After a successful test calculation, results may be finalized at symbol 120 and the mode may end at symbol 121.

The present description may indicate how the approach may be applied within a thermostat. A self-characterization load test may calculate both the W and Y loads regardless of loads being configured or connected. (See FIG. 2 for the pertinent circuits of the loads.) If a load is not connected, then the test may skip that load and move on to the next load. If the loads have been calculated already through a previous self-characterization load test or on an on-cycle characterization test, then the self-characterization load test will not necessarily be run on that load and the previously calculated value may remain unchanged.

The self-characterization load test may be run after the following conditions are met. A random timer may be set between, e.g., 15 and 30 minutes, after a reset or a power cycle expires. The super cap voltage may be greater than, e.g., 2.2 volts. The system is not necessarily in a call for heat or cool.

The thermostat control may be disabled once the test has started. If a call for heating or cooling is requested, then the request may be delayed until the off cycle load calculation test is complete. If the AC power is lost during the test, then the test may finish and allow normal phantom AC detection to detect the AC loss.

If the ultra-cap voltage falls below a battery boost threshold (BBT), the test may be cancelled and allow the phantom circuit charge the ultra-cap to the preconditions for the test.

The battery boost threshold may be the voltage at which phantom power transformation will use the battery to augment the charge current to keep up with the demand. This may be done because the available charge current through the connected loads is not necessarily enough to keep up with the current demand. The battery may be used for only a short amount of time and phantom will revert back to using the loads for charge current. The battery boost threshold may be a variable based on several inputs and calculations by the phantom power transformation software.

A self-characterization load test may indicate the following items. There may be sub states (i.e., "states") of the phantom state—PS_OFF_CYCLE_LOAD_CHECK. They may incorporate the initialize, start test, get baseline, test measure, stabilize measurements, calculation and finalize results states.

The "initialize state" may incorporate: 1) Clear out previous test results; 2) Set initial load values based on current load values; and 3) Test each load independent of being connected or configured.

A "start test state" may incorporate: 1) Turn "off" the following outputs—S4 High (FET 62), S5 (FET 63), S6 (FET 64), CompSplitEn, OpaSplit; 2) Turn "on" the following outputs—OpaFastLow, S4 Low; 3) Set the ChrgCSPWM to zero percent pulse; 4) If current test is a Y load, then turn "on" an S2 FET 32; and 5) If a current test is a W load, then turn "on" an S1 FET 31. Then one may move to get a baseline state.

S1 and S2 FETs may allow conduction into charge transfer block from an associated load. The S1 FET may be associated with the W load and the S2 FET may be associated with the Y load.

A move to a "get baseline state" may incorporate: 1) Increasing the PWM (pulse width modulation) charge percent until the mA charge rate is greater than 1000; 2) Once the mA charge rate is greater than 1000, then begin taking measurements of VSplit; 3) Once a 1000 mA charge rate is reached, then let the A2D settle for 4 seconds before taking the baseline readings; 4) Take an average of 4 readings of the VSplit for use later; and 5) After this has been completed, then go to a test measure state.

A "test measure state" may incorporate: 1) Read the mA charge rate and the VSPLIT A2D; 2) If the measured VSPLIT is <=the baseline reading taken above, then calculate the voltage across the load where vAC=(Baseline−VSPLIT); and 3) If the mAChargeRate >=6.0 mA OR voltage across load >=7.2 V, and the threshold on this load reached, then go to stabilize measurements state; and 4) Else increase the pwmChargePercent by 3 counts and remain in a measure state, raise the pwmChargePercent 3 counts at a time because that is about the resolution of the charge PWM.

The "stabilize measurements state" may incorporate: 1) Wait for the A2D to settle for 4 seconds before taking the readings; 2) Take 4 readings of the mA charge rate and vSplit reading without changing the PWM charge percent; 3) Calculate the voltage across load (baselineVSplit−averagedVSplit); and 4) Calculate the impedance. One may go to a calculation state.

The "calculation state" may incorporate: 1) If the Y impedance is greater than 1500 ohms, then this load is for off cycle stealing; 2) If the W impedance is greater than 1500 ohms, then this load is for off cycle stealing; and 3) If there are more loads to test, then go back to the start test state, or else move to finalize results state.

The "finalize results state" may incorporate: 1) If the load has not been calculated, then use the result as a new calculated value for the load; and 2) If the load has been calculated before, then the load value may remain unchanged.

Figure 2:
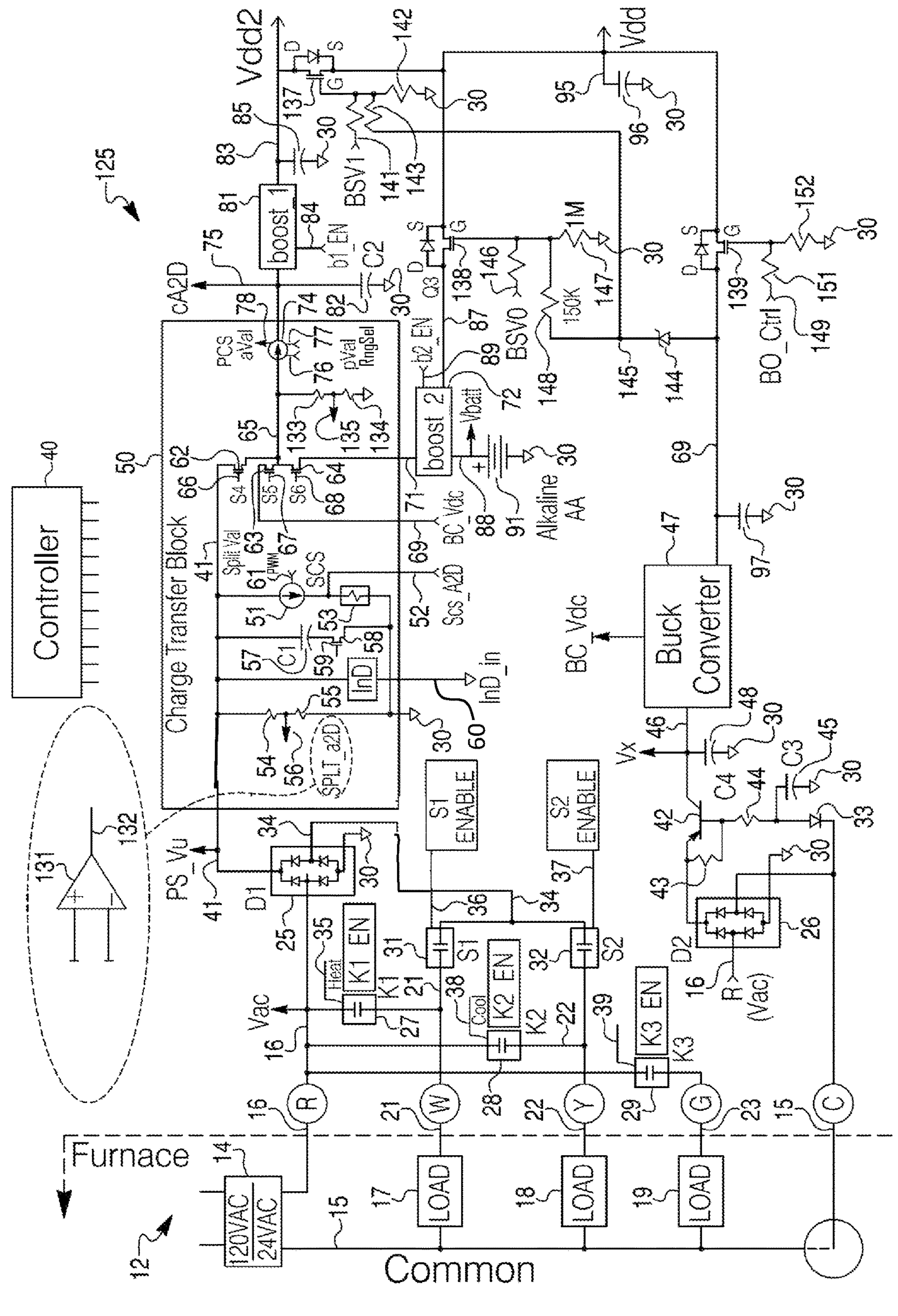
FIG. 2 is a diagram of a power transformation circuit.

FIG. 2 is a diagram of a power transformation circuit 125. Circuit 125 may provide a way to charge an internal energy storage device, for instance, a capacitor 82, in a continuous, pulsed or pseudo continuous manner. This behavior may occur in functional states of a load (17 or 18) having an "off" condition or an "on" condition. Energy may be delivered to a pre-storage device in a continuous manner relative to the impressed AC voltage. Related art systems may interrupt the load current to charge, i.e., to redirect the current into storage elements.

Since the present energy transfer approach, mechanism or block 50 may be continuous, no frequency or time dependency will necessarily exist as to when to divert the load current. Because the energy transfer is continuous, the overall currents may be much smaller than related-art power techniques. For example, a 16 mA pulse current for lm sec may essentially be the same as 1 mA taking over one entire line cycle at 60 Hz. The present approach may dramatically lower the probability of falsely tripping loads from an "off" state to an "on" state.

Power transformation topology of circuit 125 may allow energy to be drawn from two or more loads (e.g., loads 17 and 18) in a simultaneous fashion while the loads are in an "off" or "on" state. This may allow for a higher degree of load current to be transformed into a charging current of an energy harvesting system.

Power transformation may precisely calculate the load impedance as a function independent of applied power frequency. Therefore, a calculation may allow inductive or capacitive loads to be correctly categorized. Power transformation circuit 125 may be particularly interesting when one understands the capability that the transformation circuit 125 topology offers relative to the amount of energy that the circuit can transform into useable charging current. The topology may engage the load over a wide dynamic range (per application), transfer control of the AC load current to a programmable current source 51 while determining the load current directly. Subsequently, the system may transfer virtually all or portions of that current to a storage device, such as capacitor 82, via a secondary charging current source (CCS) 74.

The approach to balance the two programmable current sources 51 and 74 may also have a desired effect in that the current through the load is not necessarily altered other than having a minor loss of current due to an insertion of an applied voltage drop of power transformation circuit 125.

As power transformation circuit 125 may pass the entire load current from an internal activation switch to a saturated current source 51, power transformation device or charge transfer block 50 may need only to measure the current through current source 51, and calculate the effective impedance of the load via Ohm's law. A direct measurement may allow the device to set an "off" load condition that will not necessarily cause false load tripping. A direct determination may eliminate "trial" test current approaches or fixed approaches as known within related art systems. Current through source 51 may be determined by measuring the voltage drop across a 2.1 ohm resistor 53. Resistor 53 may have a different value or there may be an amplifier on line 52 for a gain change.

Inductive relay loads may be known to exhibit a high degree of inrush current when they are activated. The inrush may occur during times when a physical armature in a load 17 or 18 is moving or is about to move. Over a life and application usage, the inrush component may increase. The effect may be dramatic when debris has become lodged in the device. It is not necessarily wise to limit such current in any manner since the device will not necessarily reach a satisfactory "on" state, or the device may chatter and ultimately lead to having contact failure or equipment stress. For this reason, the power transformation topology may use a parallel switch structure (i.e., switches 27 and 31 for load 17 and switches 28 and 32 for load 18) which is firstly engaged to power the loads.

The power transformation topology may determine whether the system is connected to an inductive load (e.g., with a moveable armature) with several approaches. A determination may be important for setting the optimal value for an "off" state energy transformation. Independent of the inrush, the steady state AC current of a contactor relay load may be different when activated or not activated. The power transformation topology may have several mechanisms to deal with the discrepancy in order to increase the fidelity of charge rates. A measure of inductive impedance may be used to provide a steady state compensation value against for an off cycle approach.

One mechanism is that a direct impedance calculation may be made when the relay is in an "on" state. When a device sets the "off" mode power transformation level, the device may test the desired voltage drop which actually occurred across the load. If the resultant drop is more than expected, then this means that an inductive load with an armature may certainly be present provided that the VAC is monitored and compensated for. The present power transformation system may easily compensate for the impedance difference.

Another mechanism may be able to derive that the armature has moved, by detection of a sudden impedance change through plausibility testing or "direct observation" via characterization. Either of these techniques may be invoked after determining if the split current source (SCS) has enough dynamic range to overcome the inrush of the contactor; otherwise, reliability of the system may be compromised.

As to a first option, it may be possible to increment the first current source while observing the resultant current value. When one of the increments results in a slope inflection outside of what was previous predicted by past incremental changes, there may be an implication that an armature has been moved by a sudden impedance change. Otherwise, there may be a linear response depending on step size.

Figure 4:
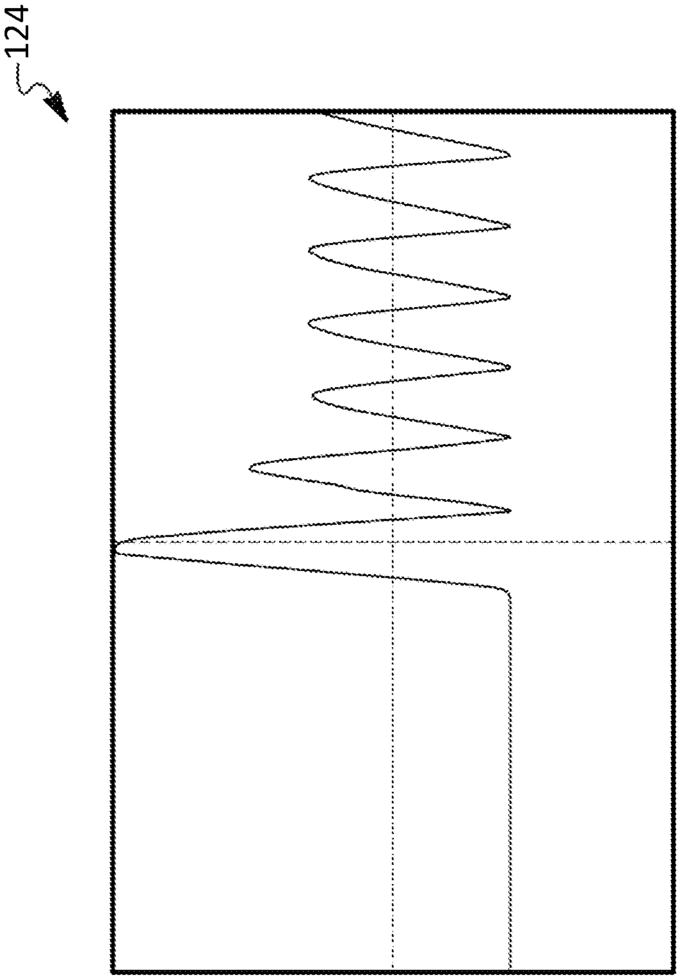
FIG. 4 is a diagram of a waveform that may illustrate an inductive load with armature movement.
Figure 5:
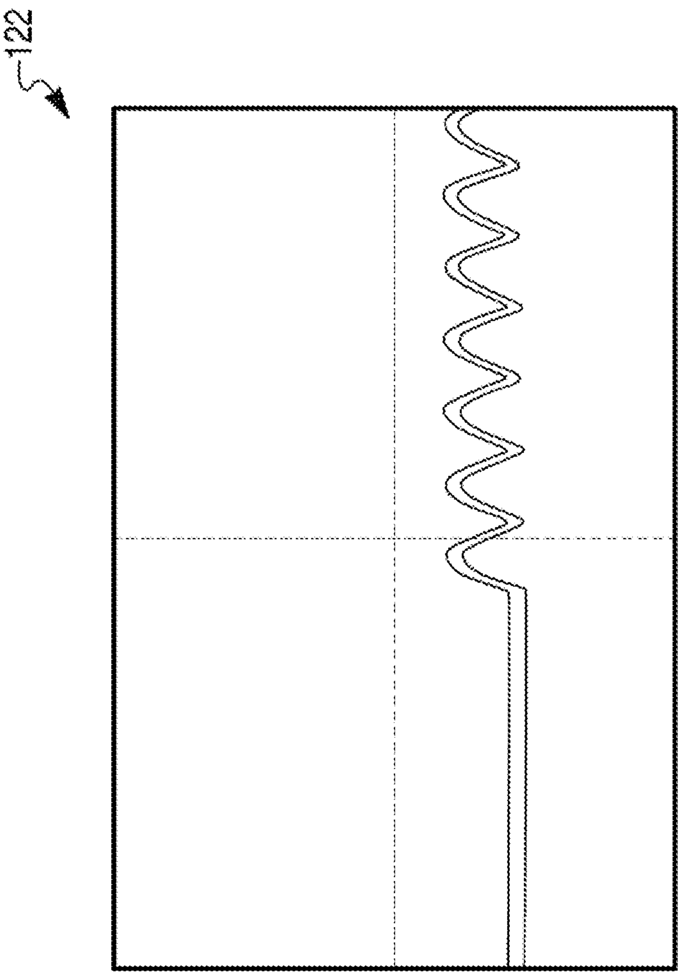
FIG. 5 is a diagram of a waveform that may illustrate a resistive load with armature movement.

As to a second option, it may also be possible to apply the first current source at a maximal current level (saturated) and perform a fast A2D process on that resultant current wave form, allowing the capture of step changes that may have occurred in its response, as caused by an armature moving, which may be a form of load characterization. FIGS. 4 and 5 are waveform diagrams that may illustrate the current waveform at an SCS_a2d 52 (i.e., a connection between SCS 51 and resistor 53). The waveform diagram 124 of FIG. 4 may illustrate a case for an inductive load with armature movement. The waveform diagram 122 of FIG. 5 may demonstrate a case of a resistive load with armature movement.

The waveforms of FIGS. 4 and 5 may illustrate that increasing the amount of charging current that a relay load can manage prior to pull in may be optimally achieved with the load in an "off" state, since a primary technique of a direct impedance calculation at running a load may result in an impedance lower than what exists in the "off" state of the load. The measurement obtained with the direct impedance calculation may be safe from the perspective on being conservative so as not to cause false activation of loads.

An internal parasitic nature capacitance loading may cause losses in what can be transformed to energy storage. A loss may occur when a rectified voltage is impressed across a capacitor (for instance, capacitor 57). (FIG. 2.) An example value of capacitor 57 may be 47 microfarads. The charging ripple current may be wasted back to a load as it cannot necessarily be converted to a charging current. One the other hand, the capacitance may help to balance the current though the secondary current source which aids an "on" cycle mode. Power transformation circuit 125 may utilize a FET 58 with a gate 59 control to introduce bulk capacitance when it is beneficial and eliminate the bulk capacitance when it is detrimental.

An approach may be utilized to determine load impedance. Impedance information may be used in a following manner. One may select a continuous (or pulsed) off cycle power level per terminal. That level should not exceed levels of a typical electronic interface logic circuit consistent with TTL, CMOS, or other logic.

Split dynamic power transformation may allow energy to be harvested off a power line 16 when a load 17 or 18 is energized by the power line. A load of interest may be firstly selected by activating switch 31 or 32 (51 or S2, respectively). Power transformation circuit 125 may then capture an A2D value on a Split_A2D at a connection point 56 of series connected resistors 54 and 55 forming a voltage divider between a rectifier output voltage line 41 and output reference line 30. The readings may have important information relative to the power transformation device.

One may determine if a load is connected according to terminal 56 for Split_A2D, and provide directional information about the magnitude of the applied voltage, VAC, as indicated by voltage divider point 56 between resistors 54 and 55 and a load 17 and/or 18, except for some diode voltage drop in full-wave rectifier 25 (D1). The internal voltage divider impedance may be chosen to be at least two orders of magnitude higher than useful load values. The internal impedance values may be, for instance, 205K ohms and 14.7K ohms, as compared to loads in which useful energy can be derived may be from 10 to 2K ohms at 60 Hertz. One may see from an inspection that the load impedance does not necessarily significantly alter a present view point of VAC based on an authority of an external network. The diode network influence of rectifier 25 may provide or need some compensation as the current through the network is bound and dominated by an internal resistor network. System 125 may indicate a power transformation error if the value returned indicates that the load is too high or the VAC is too low.

A load of interest may be completely energized by a parallel load control device 27 and/or 28 (K1 and/or K2). SCS 51 may be configured to a saturated condition with respect to its drop introduced against load 17 and/or 18. It can be noted that switch 27 and/or 28 (K(n)) may then be deselected and the load current may be transferred to internal SCS 51 in its entirety. All load current may come in and control of it is taken. The value of the current may be determined by a direct reading of SCS_a2d at the connection point of SCS 51 and resistor 53. With this reading (and VAC bound from the reading determined above), for mechanism 131 (FIG. 2), the impedance of load 17 and/or 18 may be closely estimated using Ohm's law. That may be indicated by the voltage of line 41 as determined by divider combination of resistors 54 and 55 divided or bound above by mechanism 131, by the current indicated by the voltage across resistor 53. That value may be used for an "off" cycle power transformation and the VAC may be recorded and tracked on a periodic basis.

Power transformation may incorporate a special network to speed up the process to transition from the fully saturated condition to a level where the split current source (SCS) 51 comes out of saturation. The behavior of a new circuit, InD 60, may allow SCS 51 to find the point at which perturbation in a load 17 and/or 18 connected line can occur because of a present configuration relative to a rectified and non-filtered voltage being applied to a current source working with a dc biased op-amp. Op-amp overshoot during the valleys associated with the applied VAC may cause current injection which in-turn can cause line perturbation which directly indicates that the SCS 51 is coming out of saturation. Once this point is determined, the pulse width modulation (PWM) signal to an input 61 of SCS 51 may be increased slightly to stop the firing of an InD circuit 60 and a bulk capacitor may be activated to smooth out the applied voltage presented to SCS 51. SCS 51 may be further eased out of saturation as part of the next step.

InD circuit 60 may eliminate a need to perform an a2d conversion with stabilization times involved after each incremental value.

A CCS 74 may reside in parallel with the SCS 51. An initial value may be programmed in CCS 74. The SCS 51 circuit may be connected across CCS 74 by activating FET 62 (S4) in a high bias (voltage) mode.

The PWM value to line 61 of SCS 51 may be lowered until SCS 51 comes out of saturation and a value of about a 3.0 VDC drop is achieved across SCS 51 and in turn CCS 74. Therefore, the current through the split current source 51 may be transformed as charging current via CCS 74. Depending on the load, SCS 51 may go to zero or remain active such that the current through load 17 and/or 18 is not necessarily affected other than by an introduction of a drop across the internal network of charge transfer block 50. The drop may incorporate rectifier (D1) 25. Rectifier 25 may utilize Schottky diodes which result in fewer effects than ordinary non-Schottky diodes. The drop of switch (S4) 62 may be calibrated out. This is via feedback on aVal 78.

At the voltage divider of resistors 54 and 55 with a line 56 at the junction of resistors 54 and 55, a comparator 131 may have a non-inverting input connected to line 56, and an inverting input connected to a voltage reference. An output 132 of comparator 131 may indicate with a binary signal PT_EN (start) whether the voltage at line 56 is below, meets or exceeds the voltage reference. Resistors 54 and 55 may have high resistance with the comparator 131 and thus be quite a low current drain on line 41 of the charge transfer block 50.

Another voltage divider may have resistor 133 connected to line 65 and resistor 134 connected to ground 30, with a line 135 connected to a junction of resistors 133 and 134. Line 135 may be connected to a comparator like the arrangement of comparator 131.

Battery 91 may be a single battery or a multitude of them. The battery may be a non-rechargeable or a rechargeable one with appropriate charging circuitry.

The drain of FET 137 may be connected to line 83, the source may be connected to line 95 of the Vdd output. A control signal may go to an input via a 634 ohm resistor 141 to the gate of FET 137. The gate may be connected to ground 30 via a one meg-ohm resistor 142. The gate may also be connected to a line 69 of an output of buck converter 47, via a 150 kilo-ohm resistor 143, line 145 and a Zener diode 144. The anode of diode 144 may be connected to line 69.

Values of noted components noted herein are examples but could be other values.

A control signal may go to an input 146 via a 634 ohm resistor to the gate of FET 138. The gate may be connected to line 145 via a 150 kilo-ohm resistor 148. The gate of FET 138 may be connected to a ground 30 via a one-meg-ohm resistor 147. The source may be connected to line 95. The drain may be connected to line 87.

A control signal may go to an input 149 via a resistor 151 to FET 139. The gate may be connected to ground 30 via a resistor 152. The drain may be connected to line 69 and the source may be connected to line 95.

The power transformation approach may incorporate a FET logic control to improve the various modes needed by the application in order to power at least two power rails, VDD and VDD2.

BSV1, BSV0, B0_Ctrl may be configured to be connected to pins of micro controller 40 that are Hi Z at power up.

B2_EN may have an integral pull up such as high (active) when a battery is installed.

Function split_A2D may be run with a discrete go no-go circuit; in this case, the micro controller pin may read it as a general TO instead of an A2d process.

A furnace system 12 showing a step-down 120/24 VAC transformer 14 may have a common line 15 and a 24 VAC hot line 16. Common line 15 may be regarded as a ground or reference voltage for furnace system 12. Also, common line 15 may be connected to one side of loads 17, 18 and 19. Loads 17, 18 and 19 may have another side connected to lines 21, 22 and 23, respectively. Loads 17, 18 and 19 may relate to heating, air conditioning, and ventilation, respectively. The loads may instead relate to other kinds of components. Terminals connecting lines 16, 21, 22, 23 and 15 between furnace 12 and power transformation system 125 may be labeled "R", "W", "Y", "G" and "C", respectively.

Line 16 may be connected to a first terminal of a full wave rectifier 25, a first terminal of a full-wave rectifier 26, a first terminal of a relay 27, a first terminal of a relay 28 and a first terminal of a relay 29.

Line 21 may be connected to a second terminal of relay 27 and a first terminal of a relay 31. Line 22 may be connected to a second terminal of relay 28 and a first terminal of a relay 32. Line 23 may be connected to a second terminal of relay 29. Line 15 may be connected to a second terminal of full-wave rectifier 26 and to a cathode of a diode 33. A second terminal of full-wave rectifier 25 may be connected to a second terminal of relay 31 and a second terminal of relay 32 via a line 34.

Relay 27 may be controlled by a signal from a controller 40 via a line 35. Relay 31 may be controlled by a signal from controller 40 via a line 36. Relay 32 may be controlled by a signal from controller 40 via a line 37. Relay 28 may be controlled by a signal from controller 40 via a line 38. Relay 29 may be controlled by a signal from controller 40 via a line 39.

The third terminals of rectifiers 25 and 26 may be connected to a common ground or reference voltage terminal 30 of power transformation system 125. The fourth terminal of rectifier 25 may be connected to a line 41 to a charge transfer block 50. The fourth terminal of rectifier 26 may be connected to an emitter of a PNP transistor 42.

A resistor 43 may have a first end connected to the emitter of transistor 42 and a second end connected to a base of transistor 42. A resistor 44 may have a first end connected to the base of transistor 42 and a second end connected an anode of diode 33. A capacitor 45 may have a first terminal connected to the anode of diode 33 and a second terminal connected to ground 30. A collector of transistor 42 may be connected to a line 46 to an input of a buck converter 47. A capacitor 48 may have a first terminal connected to the collector of transistor 42 and a second terminal connected to ground 30. This may be a C wire selector/monitor reading Vx, and BC_Vdc.

Charge transfer block 50 may incorporate a split current source 51 having a first terminal connected to line 41 and a second terminal connected to a line 52. Line 52 may be connected to first end of a low ohm (e.g., 2.5 ohms) resistor 53. A second end of resistor 53 may be connected to ground 30. An input for a value to current source 51 may be provided on line 61 to source 51.

Block 50 may incorporate a voltage divider having a resistor 54 and a resistor 55. Resistor 54 may have a first end connected to line 41 and a second end connected to a line 56 and to a first end of resistor 55. Resistor 55 may have a second end connected to ground 30.

Block 50 may incorporate a capacitor 57 having a first terminal connected to line 41. Capacitor 57 may have a second terminal connected to a first terminal of a FET or switch 58. A second terminal of switch 58 may be connected to ground 30. Switch 58 may be controlled by a signal from controller 40 via a line 59 to its gate or control terminal of FET or switch 58.

A FET or switch 62 may have a first terminal connected to line 41 and a second terminal connected to a line 65. FET or switch 62 may have a gate or third terminal connected to a line 66 for receiving a signal to control FET or switch 62. A FET or switch 63 may have a first terminal connected to a line 69 which is connected to an output of buck converter 47. Switch 63 may have a second terminal connected to line 65. A gate of third terminal of FET or switch 63 may be connected to a line 67 for receiving a signal to control switch 63. A FET or switch 64 may have a first terminal connected to line 65 and have a second terminal connected to a line 71. Line 71 may be connected to a first terminal of a boost circuit 72. A gate or third terminal of FET or switch 64 may be connected to a line 68 for receiving a signal to control switch 64.

A programmable current source 74 may have a first terminal connected to line 65. Source 74 may have a second terminal connected to a line 75. A third terminal and a fourth terminal may be connected to a line 76 and a line 77, respectively for inputs to source 74 for setting a range. A fifth terminal may be connected to a line 78 for providing an output indication from source 74.

A capacitor 82 may have a first terminal connected to line 75 and a second terminal connected to ground 30. A boost circuit 81 may have a first terminal connected to line 75. A second terminal of boost circuit 81 may be connected to an output line 83. A third terminal of boost circuit 81 may be connected to a line 84 which can provide a signal for controlling boost circuit 81.

A capacitor 85 may have a first terminal connected to line 83 and a second terminal connected to ground 30.

Boost circuit 72 may have a second terminal connected to a line 88. A third terminal of boost circuit 72 may be connected to an output line 87. A fourth terminal of boost circuit 72 may be connected to a line 89 which can provide a signal for controlling boost circuit 72. A battery assembly 91 may have a positive terminal connected to line 88 and a negative terminal connected to ground 30.

Some power stealing systems may appear to have had issues working with furnace topologies which incorporate simple control systems. A particular class of equipment may have utilized the power controlled by the W terminal in series configuration with flame safety interlocks. Power stealing with this series connected load may have historically made the conventional power stealing problem difficult as the gas valves used in the furnace may be particularly sensitive to any voltage perturbation which will occur with energy is being diverted within the thermostat to run the thermostat in the most basic two wire system. "W" may represent a heat relay or switch terminal, or the like. "C" may represent a 24 V common terminal or the like.

Figure 3:
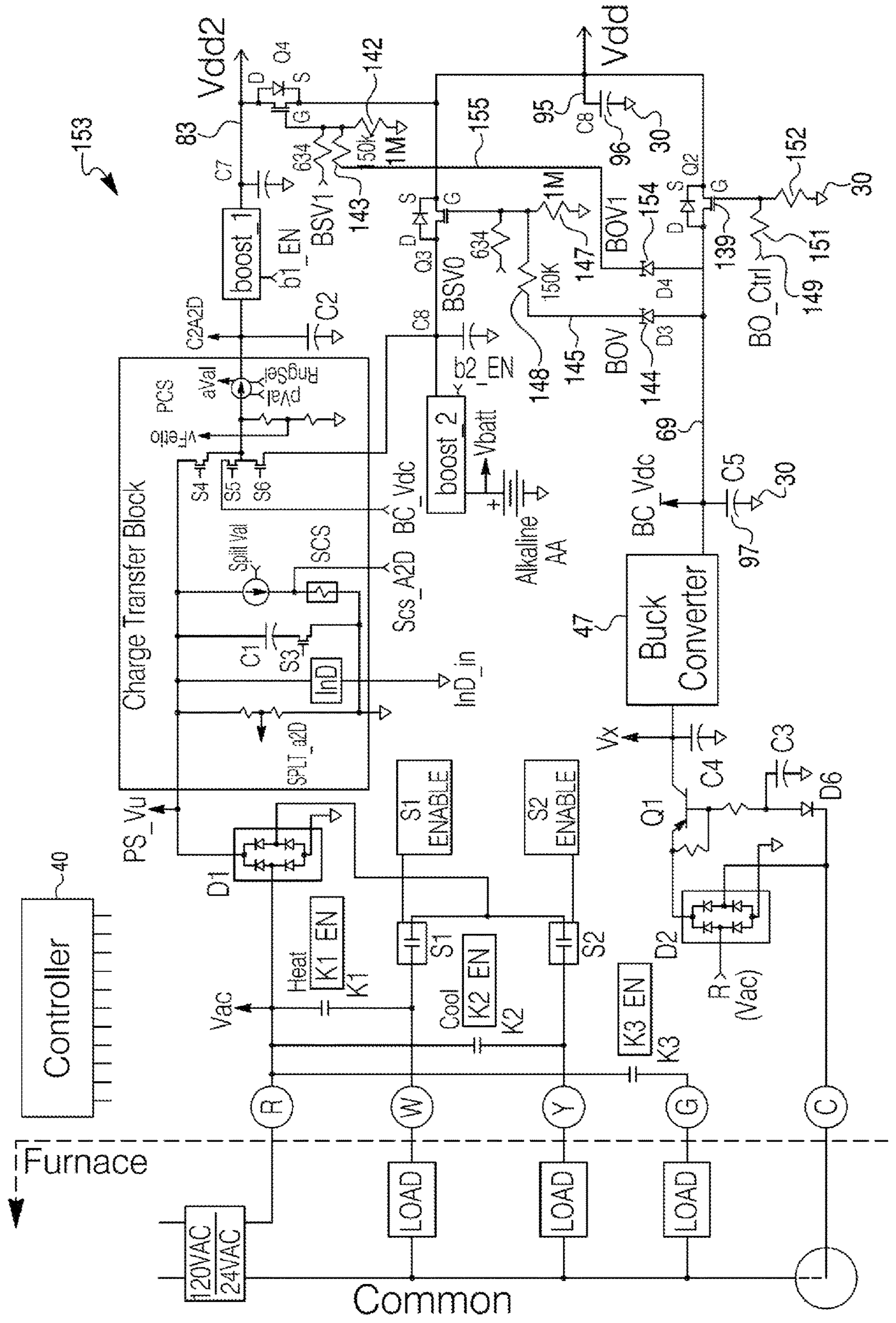
FIG. 3 is a diagram of a circuit which may be similar to the circuit of FIG. 2 but with several different components.

FIG. 3 is a diagram of a circuit 153 which may be similar to circuit 125 of FIG. 2. However, there may be a few differences. For instance, line 155 may be connected from resistor 143 to a cathode of a Zener diode 154. An anode of Zener diode 154 may be connected to line 69. Many of the unnumbered components of circuit 153 may have the same numerical designations as the like components of circuit 125. The components may have inputs and/or outputs that can provide various output power modes.

To recap, an approach for performing a power transformation self characterization mode for an heating, ventilation and air conditioning (HVAC) may incorporate obtaining a baseline of a reference voltage; determining whether the baseline obtained is equal to or greater than a predetermined or needed baseline; repeating obtaining the baseline until the baseline obtained is equal to or greater than the predetermined or needed baseline; taking a measurement of a charge rate or a measurement of a voltage across an HVAC load; determining whether the charge rate is equal to or greater than a predetermined charging threshold or determining whether the voltage across the HVAC load is equal to or greater than a predetermined voltage threshold; determining whether the charge rate is zero, if neither the charge rate is equal to or greater than the predetermined charging threshold, nor the voltage across the HVAC load is equal to or greater than the pre-determined voltage threshold; stabilizing the measurements, if the charge rate is equal to or greater than the predetermined charging threshold, or if the voltage across the HVAC load is equal to or greater than the predetermined voltage threshold; returning to taking a measurement of the charge rate if the charge rate is not zero; testing a calculation if the charge rate is zero or if upon the stabilizing the measurement; and finalizing results if the calculation is tested as satisfactory.

The load, selected from a group of one or more loads, may have a first terminal connectable to a first terminal of a power supply. A rectifier module may have a first terminal connectable to a second terminal of a power supply. A first switch may have a first terminal connected to a second terminal of the load, and have a second terminal connected to a second terminal of the rectifier module. A second switch may have a first terminal connected to the second terminal of the load, and have a second terminal connected to the first terminal of the rectifier module. A charge transfer block may have a first terminal connected to a third terminal of the rectifier module, and have a second terminal connected to a fourth terminal of the rectifier module. A capacitor may have a first terminal connected to a third terminal of the charge transfer block, and have a second terminal connected to the second terminal of the charge transfer block.

The charge transfer block may incorporate a voltage indicator having a first terminal connected to the first terminal of the charge transfer block, and have a second terminal connected to the second terminal of the charge transfer block.

The charge transfer block may further incorporate a first current source having a first terminal connected to the first terminal of the charge transfer block, and a resistor having a first terminal connected to a second terminal of the first current source and having a second terminal connected to the second terminal of the charge transfer block.

Current through the first current source may be controlled by a pulse width modulation signal.

A self calculating load test mechanism may incorporate a heating, ventilation and air conditioning (HVAC) load selected for calculation, and a load test run on the HVAC load upon meeting predetermined conditions indicated by a thermostat control circuit, and thermostatic control of the HVAC load is disabled when the load test has started. If a call for heat or cool is made at the thermostat, a response to the call may be delayed until the load test is completed, and if AC power is lost during the test, the test may finish and allow AC detection of the phantom AC detection device with a loss of AC power. If a voltage of a storage capacitor falls below a battery boost threshold (BBT), the test may be cancelled to allow the phantom circuit charge the storage capacitor to a predetermined value for the test.

The mechanism may further incorporate self calculation load test states.

The test states in sequence may incorporate an initialize state, a start test state, a get baseline state, a test measure state, a stabilize measurement state, a calculation state, and a finalize results state.

The initialize state may clear previous test results, set initial load values, and each load may be tested independent of connection or configuration.

The start test state may incorporate turning off certain outputs, turning on certain outputs of the phantom circuit, adjusting a pulse width modulation (PWM) signal to a charge current source of the phantom circuit, or connecting a load to be tested.

The baseline state may incorporate increasing a PWM signal to a charge current source of the phantom circuit to achieve a predetermined charge rate, and taking baseline voltage readings of the storage capacitor.

The test measure state may incorporate reading a charge rate of a charge current source of the phantom circuit and a baseline voltage of the storage capacitor, calculating a voltage across the load, or determining if the charge rate is equal to or greater than a predetermined current value or the voltage across the load is equal to or greater than a predetermined voltage value.

The stabilize measurements state may incorporate taking readings of a charge rate of a charge current source of the phantom circuit without changing a PMW signal charge percent input to the charge current source of the phantom circuit, calculating a voltage across the load, and calculating an impedance across the load.

The calculation state may incorporate noting that if an impedance of the load is greater than a predetermined impedance, then the load is not necessarily available for off cycle power stealing.

The finalize results state may incorporate noting that if a value of one or more parameters of the load has not been calculated, then a result of a calculation of the one or more parameters of the load may be used as a newly calculated value of the one or more parameters for the load, or if a value of the one or more parameters of the load has been previously calculated, then the value of the one or more parameters of the load may remain the same.

An approach for load calculation may incorporate setting up a test arrangement with a charge current source for charging, connecting for measuring a load of an HVAC, connecting a charge percent circuit to the charge current source, setting a charge percent rate of the charge percent circuit to zero, taking a baseline voltage measurement, setting a charge percent until a charge rate is equal to or greater than a predetermined value, taking a voltage measurement where the baseline voltage measurement was taken, and calculating a voltage across the load of the HVAC from a difference of the baseline voltage and the voltage measurement when the charge percent of the charge percent circuit is equal to or greater than the predetermined value.

The approach may further incorporate taking a plurality of voltage measurements where the baseline voltage measurement was taken but where the charge percent remains set equal to or greater than the predetermined value.

The approach may further incorporate averaging the plurality of the voltage measurements into an average voltage measurement, and calculating an average voltage across the load of the HVAC from a difference of the baseline voltage measurement and the average voltage measurement.

The approach may further incorporate calculating an impedance of the load of the HVAC from the average voltage across the load and current due to the charge percent set that remained set equal to or greater than the predetermined value.

If the impedance is greater than a predetermined value, then the load is not necessarily available for off cycle stealing.

U.S. patent application Ser. No. 13/227,395, filed Sep. 7, 2011, now U.S. Pat. No. 8,892,223, and entitled "HVAC Controller including User Interaction Log", is hereby incorporated by reference. U.S. patent application Ser. No. 14/088,312, filed Nov. 22, 2013, and now U.S. Pat. No. 9,857,091, is hereby incorporated by reference. U.S. patent application Ser. No. 14/088,306, filed Nov. 22, 2013, now U.S. Pat. No. 9,673,811, is hereby incorporated by reference. U.S. Pat. No. 7,476,988, issued Jan. 13, 2009, is hereby incorporated by reference.

Any publication or patent document noted herein is hereby incorporated by reference to the same extent as if each publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A method comprising:

obtaining a baseline of a reference voltage;

determining whether the baseline obtained is equal to or greater than a predetermined or needed baseline;

repeating obtaining the baseline until the baseline obtained is equal to or greater than the predetermined or needed baseline;

after determining the baseline obtained is equal to or greater than the predetermined or needed baseline, taking a measurement of a charge rate of a charge current source or a measurement of a voltage across an HVAC load;

determining whether the charge rate is equal to or greater than a predetermined charging threshold or determining the voltage across the HVAC load is equal to or greater than a predetermined voltage threshold;

determining whether the charge rate is zero, if neither the charge rate is equal to or greater than the predetermined charging threshold, nor the voltage across the HVAC load is equal to or greater than the pre-determined voltage threshold;

stabilizing the measurements, if the charge rate is equal to or greater than the predetermined charging threshold, or if the voltage across the HVAC load is equal to or greater than the predetermined voltage threshold;

returning to taking a measurement of the charge rate if the charge rate is not zero; and testing a calculation, the calculation including calculations of one or more loads, if the charge rate is zero or upon stabilizing the measurement.

2. The method of claim 1, wherein:

the load, selected from a group of one or more loads, has a first terminal connectable to a first terminal of a power supply;

a rectifier module has a first terminal connectable to a second terminal of the power supply;

a first switch has a first terminal connected to a second terminal of the load, and has a second terminal connected to a second terminal of the rectifier module;

a second switch has a first terminal connected to the second terminal of the load, and has a second terminal connected to the first terminal of the rectifier module;

a charge transfer block has a first terminal connected to a third terminal of the rectifier module, and has a second terminal connected to a fourth terminal of the rectifier module; and a capacitor has a first terminal connected to a third terminal of the charge transfer block, and has a second terminal connected to the second terminal of the charge transfer block.

3. The method of claim 2, wherein the charge transfer block comprises a voltage indicator having a first terminal connected to the first terminal of the charge transfer block, and having a second terminal connected to the second terminal of the charge transfer block.

4. The method of claim 3, wherein the charge transfer block further comprises:

a first current source having a first terminal connected to the first terminal of the charge transfer block; and a resistor having a first terminal connected to a second terminal of the first current source, and having a second terminal connected to the second terminal of the charge transfer block.

5. The method of claim 4, wherein current through the first current source is controlled by a pulse width modulation signal.

6. The method of claim 1, wherein obtaining the baseline of the reference voltage comprises:

increasing a pulse width modulation signal to the charge current source of a phantom circuit to achieve a predetermined charge rate of a storage capacitor; and taking baseline voltage readings of the storage capacitor.

7. The method of claim 1, wherein stabilizing the measurements comprises:

determining the charge rate of the charge current source of a phantom circuit without changing a pulse width modulation signal charge percent input to the charge current source; and determining a voltage across the HVAC load; and determining the impedance across the HVAC load.

* * * * *